(12) United States Patent
Saado et al.

(10) Patent No.: US 7,231,567 B2
(45) Date of Patent: Jun. 12, 2007

(54) METHOD AND/OR APPARATUS FOR PERFORMING STATIC TIMING ANALYSIS ON A CHIP IN SCAN MODE WITH MULTIPLE SCAN CLOCKS

(75) Inventors: Alon Saado, San Diego, CA (US); Linley Young, San Diego, CA (US)

(73) Assignee: Via Telecom Co., Ltd., San Diego, CA (US)

( * ) Notice: Subject to any disclaimer, the term of this patent is extended or adjusted under 35 U.S.C. 154(b) by 418 days.

(21) Appl. No.: 10/789,883

(22) Filed: Feb. 27, 2004

(65) Prior Publication Data

US 2005/0193299 A1    Sep. 1, 2005

(51) Int. Cl.
*G01R 31/28*    (2006.01)
(52) U.S. Cl. .................... 714/726; 714/731
(58) Field of Classification Search ................ None
See application file for complete search history.

(56) References Cited

U.S. PATENT DOCUMENTS

| 5,459,736 A | * | 10/1995 | Nakamura | 714/731 |
| 5,471,481 A | * | 11/1995 | Okumoto et al. | 714/727 |
| 5,487,074 A | * | 1/1996 | Sullivan | 714/727 |
| 5,878,055 A | * | 3/1999 | Allen | 714/744 |

* cited by examiner

*Primary Examiner*—Christine T. Tu
(74) *Attorney, Agent, or Firm*—Christopher P. Maiorana, PC (57) ABSTRACT

An apparatus comprising a circuit configured to be tested and a plurality of test blocks within the circuit. Each of the test blocks generally comprises (i) a plurality of sequential elements and (ii) a plurality of logic elements. Each of the test blocks are configured to operate (a) in a first mode comprising a shift mode and (b) a second mode comprising a capture mode. The shift mode generally operates with multiple scan clocks that are clocked simultaneously. The capture mode generally operates with multiple scan clocks, but only one of which is toggled at a time.

19 Claims, 7 Drawing Sheets

METHOD AND/OR APPARATUS FOR PERFORMING STATIC TIMING ANALYSIS ON A CHIP IN SCAN MODE WITH MULTIPLE SCAN CLOCKS

FIELD OF THE INVENTION

The present invention relates to scan clocks generally and, more particularly, to a method and/or apparatus for performing static timing analysis on a chip in scan mode with multiple scan clocks.

BACKGROUND OF THE INVENTION

Conventional approaches typically test a chip after fabrication. High testability can be achieved by merging the design and test processes. One conventional testing technique is a scan design. Conventional scan design circuitry implements a serial connection of the various storage elements of a design into a scan chain. The process for inserting scan circuitry into the design involves replacing sequential elements with scannable sequential elements, and then stitching them into one or more scan registers (scan chains). The scan chain is the mechanism for shifting data in and out of the design through the primary inputs and outputs. The scan shifting operation is controlled by a scan enable pin. Shifting data into the chip puts the sequential elements in a known state. Operating the circuit with that known data, and capturing the output, allows the results to be observed and compared with expected data.

Shifting data in and out of the chain is done during a "shift mode". The operation of the circuit and capturing the data is done during a "capture mode". In the capture mode, a scan enable signal is in a non-active level, so the functional paths of the design are valid. A pulse on one or more scan clock ports is given to capture the data. A user controls how many capture clock pulses are supplied by the ATPG tool while the chip is in the capture mode. The capture mode is followed by the shift mode, and the data is shifted out and compared with expected data.

An automatic test pattern generation (ATPG) tool may be used to generate patterns to test the functionality of the chip. The ATPG tool configures the chip to be in shift mode or capture mode as needed. The patterns include data that are driven into the chip using the scan ports as well as the primary inputs. Pulses are also driven using the scan clock ports. The ATPG tool also generates expected data that is compared with the data that the chip outputs at specific times.

For verification purposes, it is important to ensure that there are no timing violations in either of the modes in order to ensure proper operation of the scan circuitry and to observe correct data. Therefore, a static timing analysis tool should be run, and setup and hold violations should be fixed. To avoid clock skew issues between clocks trees, the ATPG tool typically generates capture pulses one at a time. Analyzing the timing of non-simultaneously toggled clocks using an STA tool that normally analyzes multiple clocks as simultaneously clocked may result in false path violations being reported.

It would be desirable to implement a method and/or apparatus that (i) checks the timing of a chip while in scan mode, (ii) takes into account the non-simultaneous relations of multiple clocks in ATPG-generated vectors, and/or (iii) avoids reporting timing violations that may be falsely reported based on the special timing of the clock signals that are supplied to the chip.

SUMMARY OF THE INVENTION

The present invention concerns an apparatus comprising a circuit configured to be tested and a plurality of test blocks within the circuit. Each of the test blocks generally comprises (i) a plurality of sequential elements and (ii) a plurality of logic elements. Each of the test blocks are configured to operate (a) in a first mode comprising a shift mode and (b) a second mode comprising a capture mode. The shift mode generally operates with multiple scan clocks that are clocked simultaneously. The capture mode generally operates with multiple scan clocks, one of which is toggled at a time.

The objects, features and advantages of the present invention include providing a circuit that may (i) operate in scan mode with multiple scan clocks and/or (ii) operate with functional paths between parts of the design that are clocked by different scan clocks.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention concerns a method and/or apparatus configured to check the timing of a chip while in a scan mode when multiple scan clocks are used. Some logical paths may only be present in the scan mode (e.g., logic to bypass memories or paths forming the scan chain). In order to ensure that a particular design does not introduce timing violations, static timing analysis (STA) may be performed while the design is in scan mode. The scan mode generally has two sub-modes "a shift mode" and "a capture mode". During the shift mode, all of the scan clocks are simultaneously toggled. Therefore the standard technique of defining all scan clocks as active during static timing analysis will yield correct analysis of setup and hold violations. However, in the capture mode, the ATPG tool pulses only one scan clock at a time. Therefore, with multiple clocks, a modification to conventional STA methods is needed in order to correctly check the timing in the capture mode and to avoid triggering many false violations.

The present invention provides a method and/or apparatus that may be used when a design has (i) multiple scan clocks and/or (ii) functional paths between parts of the design that are clocked by different scan clocks.

Figure 1:
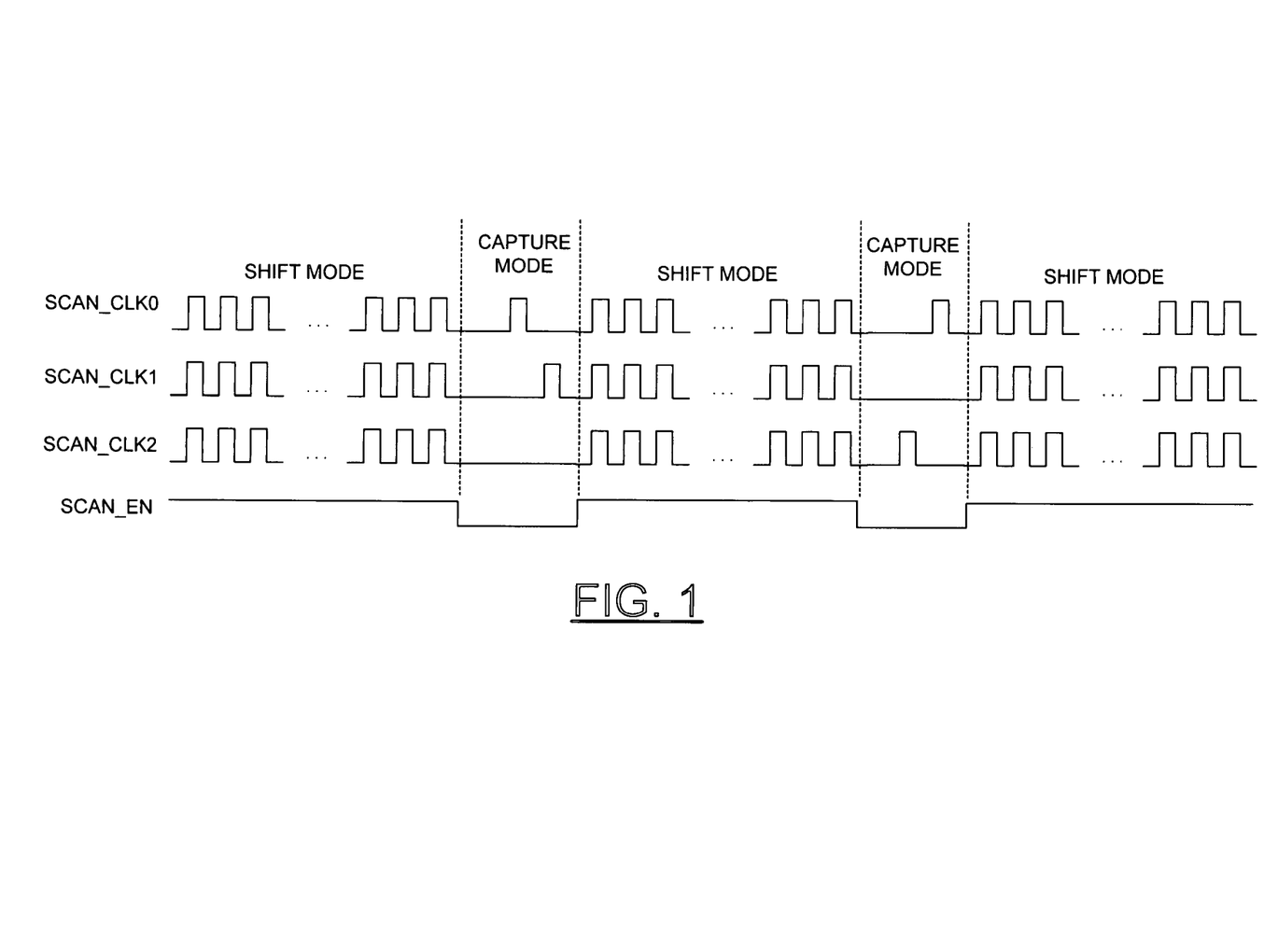
FIG. 1 is a diagram illustrating scan clocks during shift and capture modes with multiple capture pulses.

Referring to FIG. 1, a diagram illustrating typical timing waveforms is shown. The waveforms may be supplied by the ATPG tool to scan clock ports (not shown) when the user allows multiple capture pulses. A number of scan clock signals (e.g., SCAN_CLK0 and SCAN_CLK2) and a scan enable signal (e.g., SCAN_EN) are shown.

During the shift mode, the scan enable signal SCAN_EN is set to HIGH. This allows data to be shifted into one or more scan chains (to be described in more detail in connection with FIG. 2) through one or more scan data input ports. In each clock cycle, new data is shifted into each particular chain. The number of clock cycles in the shift mode is equal to the number of elements in the longest scan chain. When all of the chains are loaded, the capture mode starts. In the capture mode, the scan enable signal SCAN_EN is normally set to LOW, and an ATPG test tool (not shown) supplies capture clock pulses on the scan clock ports. Since there may be clock skew between two different clock domains, the ATPG tool generates test patterns where only one scan clock port is normally pulsed at a time so that timing violations are avoided. If there is no functional path between two or more parts of the design that are clocked by different scan clocks, the tool may supply capture pulses on more than one scan clock at the same time.

In general, three separate static timing analysis runs are needed to check the timing in scan mode. One analysis run is normally used for the shift mode. Two analysis runs are normally used for the capture mode. In the shift mode, the scan enable signal SCAN_EN is set to HIGH. The standard STA method (where all of the scan clocks are defined as active) may be used to check both setup and hold timing in the shift mode. All the clocks are supplied at the same time when in the shift mode. In the capture mode, the scan enable signal SCAN_EN is set to LOW. The functional paths are valid. The ATPG tool presents one capture pulse on only one of the scan clock ports. In the next clock cycle, the ATPG tool may give another capture clock on a different scan clock port.

Figure 2:
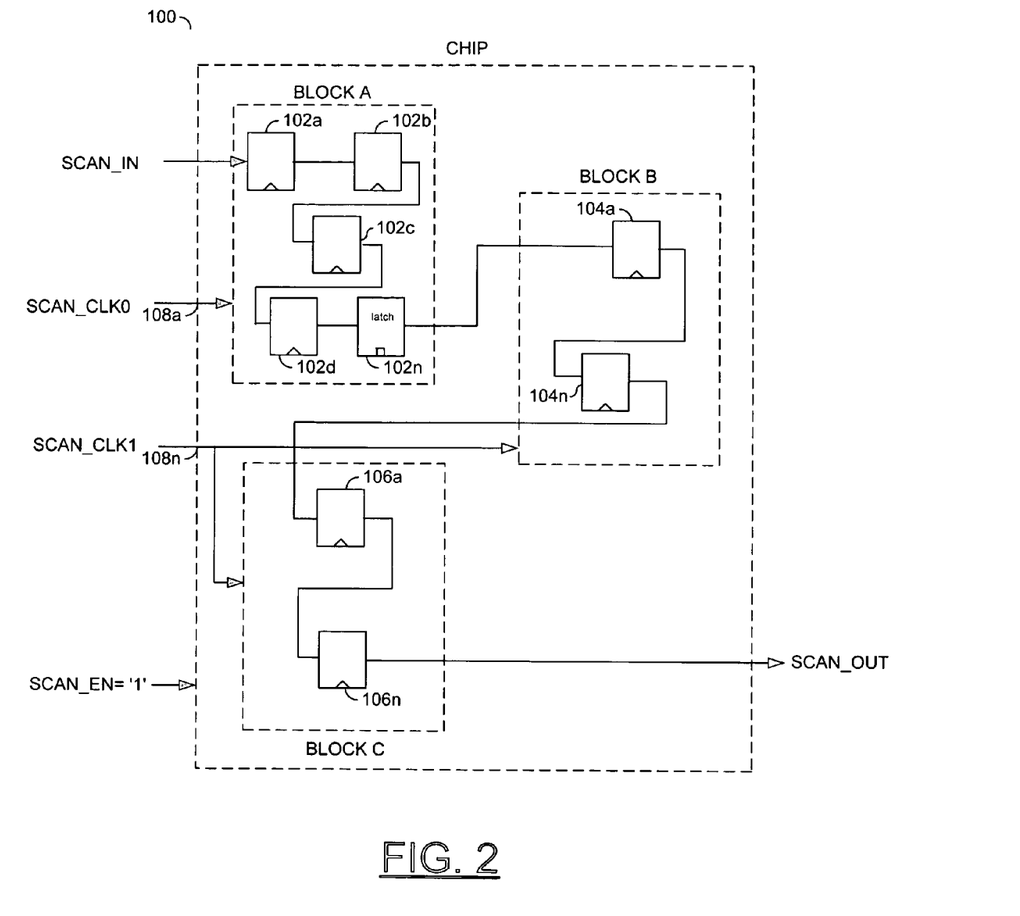
FIG. 2 is a diagram illustrating a circuit configured into a shift mode.

Referring to FIG. 2, a circuit (or chip) 100 that has been put in shift mode (e.g., by setting the signal SCAN_EN to HIGH) is shown. The circuit 100 generally comprises a block A, a block B and a block C. The block A generally comprises a number of elements 102a–102n. The elements 102a–102n may be implemented as sequential elements. In one example, the elements 102a–102n may be implemented as flip-flops clocked by one of the scan clocks (e.g., SCAN_CLK0). The sequential elements 102a–102n form a scan chain A. The block B generally comprises a number of elements 104a–104n. The elements 104a–104n generally form a scan chain B. The block C generally comprises a number of elements 106a–106n. The elements 106a–106n form a scan chain C. Since the block A, the block B and the block C are clocked by different scan clocks SCAN_CLK0-SCAN_CLK1, the last element 102n, at the end of the first sub-chain in block A, may be implemented as a lock-up latch. The lock-up latch 102n generally prevents timing violations when data is shifted in and out of the scan chain of the block A. In the example of FIG. 2, two scan clocks are implemented (e.g., SCAN_CLK0 and SCAN_CLK1). However, additional clocks may be implemented to meet the design criteria of a particular implementation. The scan clocks SCAN_CLK0 and SCAN_CLK1 are normally supplied to the circuit 100 simultaneously in the shift mode.

When all of the scan chains A, B and C are loaded through the shift mode, the capture mode starts. When the circuit 100 is in the capture mode, the scan enable signal SCAN_EN is set to LOW, and the functional paths are tested. The ATPG test supplies capture clock pulses on one or more scan clock ports 108a–108n. Since there may be clock skew between two different clock domains (e.g., SCAN_CLK0 and SCAN_CLK1), the ATPG tool (not shown) generates test patterns where only one of the scan clock ports 108a–108n is pulsed at a time so that timing violations may be avoided. If there is not a functional path between two or more parts of a particular design that is clocked by different scan clocks, the ATPG tool may supply capture pulses on more than one scan clock at the same time.

Figure 3:
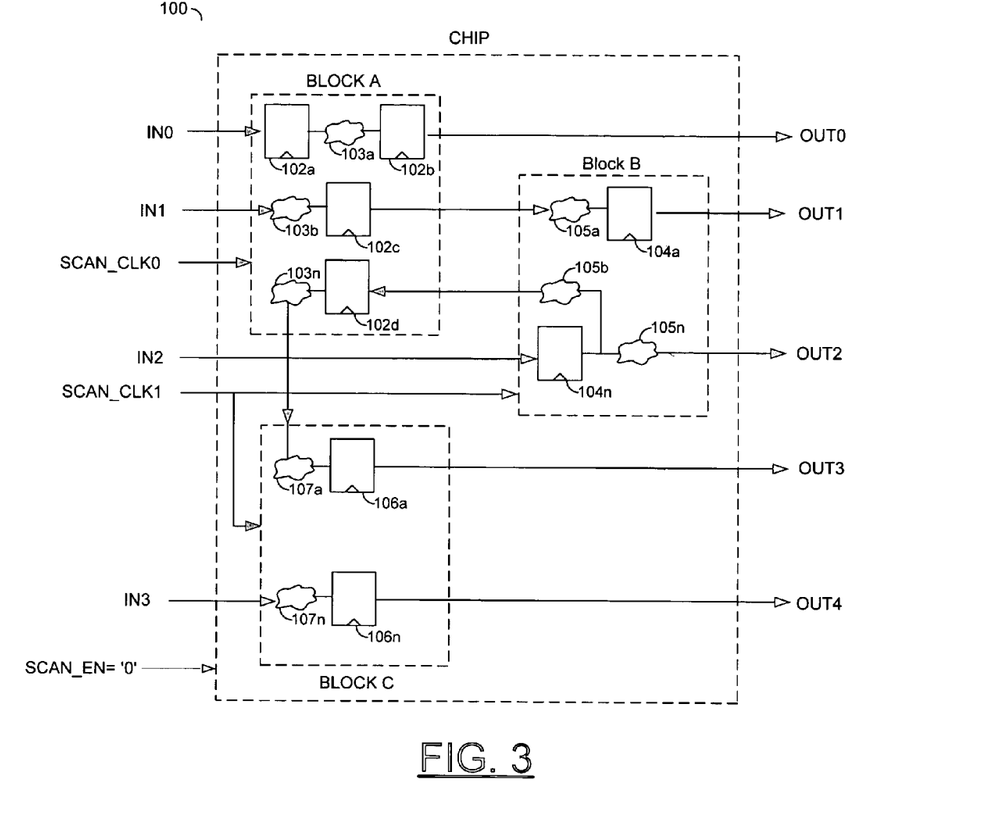
FIG. 3 is a diagram illustrating a circuit configured into a capture mode.

Referring to FIG. 3, an example of a chip 100 that has been put into capture mode (e.g., by setting the signal SCAN_EN to LOW) is shown. The functional paths are valid. A number of logic clouds 103a–103n, 105a–105n and 107a–107n (e.g., combinational logic) are shown in addition to the sequential elements 102a–102n, 104a–104n, and 106a–106n. In the capture mode, the signal SCAN_CLK0 is pulsed. The sequential elements 102a–102n are normally clocked by the signal SCAN_CLK0 and may capture data from primary inputs (e.g., IN0 or IN1). The sequential elements 102a–102n may also capture data from other sequential elements or logic clouds within the same functional block or from a different block. The signal SCAN_CLK0 is then held inactive while the signal SCAN_CLK1 is pulsed. The particular sequential elements that are clocked by the signal SCAN_CLK1 then capture data from the primary inputs IN2 or IN3 (or by other sequential elements or logic clouds). The data that has been captured into all of the sequential elements 106a–106n during capture mode is validated by comparing the primary output signals (e.g., OUT0–OUT4) to expected data and also during shift mode.

Figure 4:
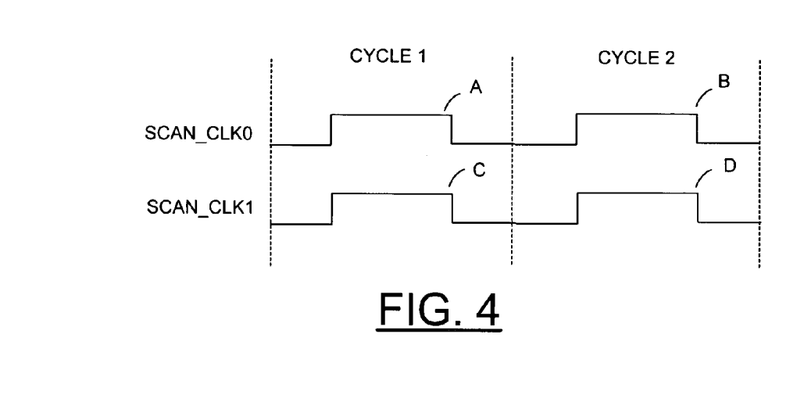
FIG. 4 is a diagram illustrating multiple scan clocks active in an STA.
Figure 5:
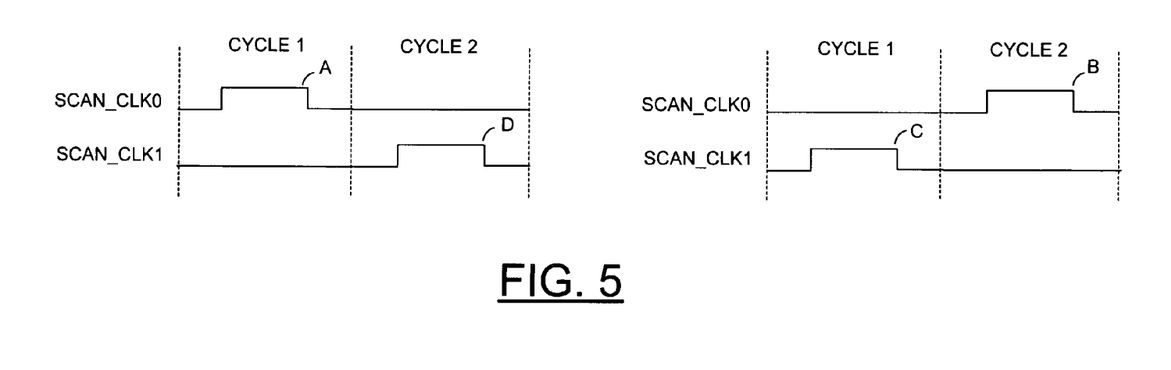
FIG. 5 is a diagram illustrating ATPG test pattern clocks in the capture mode.

Referring to FIG. 4, an example illustrating two scan clocks is shown. When the clocks are defined with the same timing parameters for the STA tool, the STA tool assumes that the clocks are clocked every cycle. However, since the ATPG tool generates test patterns where only one scan clock is pulsed at a time, the pulses B and C (or the pulses A and D) do not actually exist. The ATPG tool may actually generate one of the clock patterns as shown in FIG. 5.

Therefore, the timing analysis should be done in two runs in capture mode. The first run generally comprises a setup timing check. All of the clock signals are normally defined with essentially identical timing parameters. Only the setup report should be checked, and the violations should be fixed. The hold violations should be ignored since such violations may include violations which are false.

Figure 6:
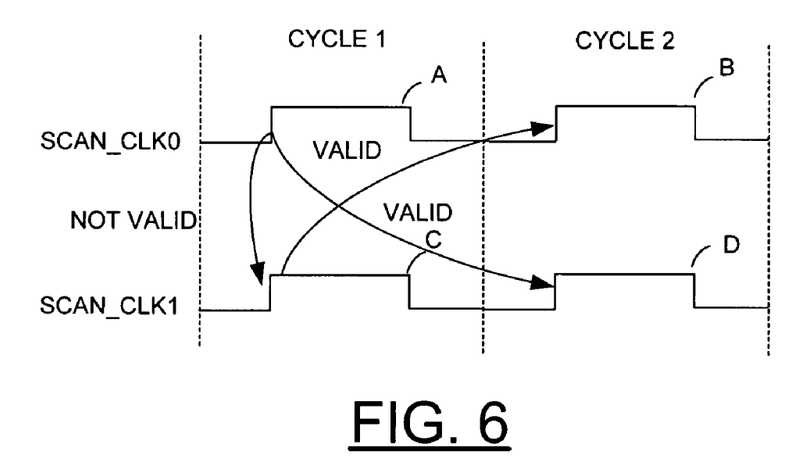
FIG. 6 is a diagram illustrating timing arcs the STA tool analyzes.

Referring to FIG. 6, timing arcs between the pulses A and D, and between the pulses C and B are shown. The timing within one clock domain (not shown) is checked as well (e.g., the timing between pulses A and B, and C and D). The timing between pulses A and C should be ignored (e.g., not a valid case since the pulse A and the pulse C are not pulsed simultaneously). Therefore, the hold violations may be ignored.

A second run generally comprises a hold check. All of the clocks should be defined, but there should be one or more SET_FALSE_PATH statements between each clock and the other clocks. The SET_FALSE_PATH statements instruct the STA tool to ignore timing arcs between two clock domains. For example, if there are 3 scan clocks, the following statements may be applied:

---

SET_FALSE_PATH -from SCAN_CLK0 -to SCAN_CLK1
SET_FALSE_PATH -from SCAN_CLK0 -to SCAN_CLK2

-continued

```
SET_FALSE_PATH -from SCAN_CLK1 -to SCAN_CLK0
SET_FALSE_PATH -from SCAN_CLK1 -to SCAN_CLK2
SET_FALSE_PATH -from SCAN_CLK2 -to SCAN_CLK0
SET_FALSE_PATH -from SCAN_CLK2 -to SCAN_CLK1
```

The syntax of the SET_FALSE_PATH command may be used by particular STA tools (e.g., PrimeTime, produced by Synopsys) as part of the command set. Other commands may be implemented for the particular STA tool used. However, the particular syntax used normally instructs the particular tool to ignore timing arcs between two clock domains.

Referring to FIG. 6, by implementing SET_FALSE_PATH statements, the tool ignores hold checks between the pulses A and C, but checks hold time between flip-flops of the same clock domain. The hold report should be checked, and the violations should be fixed.

If the user chooses to allow only one capture pulse per capture mode while running the ATPG tool and creating test patterns, only one run is needed. All of the clocks should be defined, and similar to the second run of the previous case, there should be one or more SET_FALSE_PATH statements between each clock and the other clocks. The user should check the setup as well as the hold violations, and the violations should be fixed.

Figure 7:
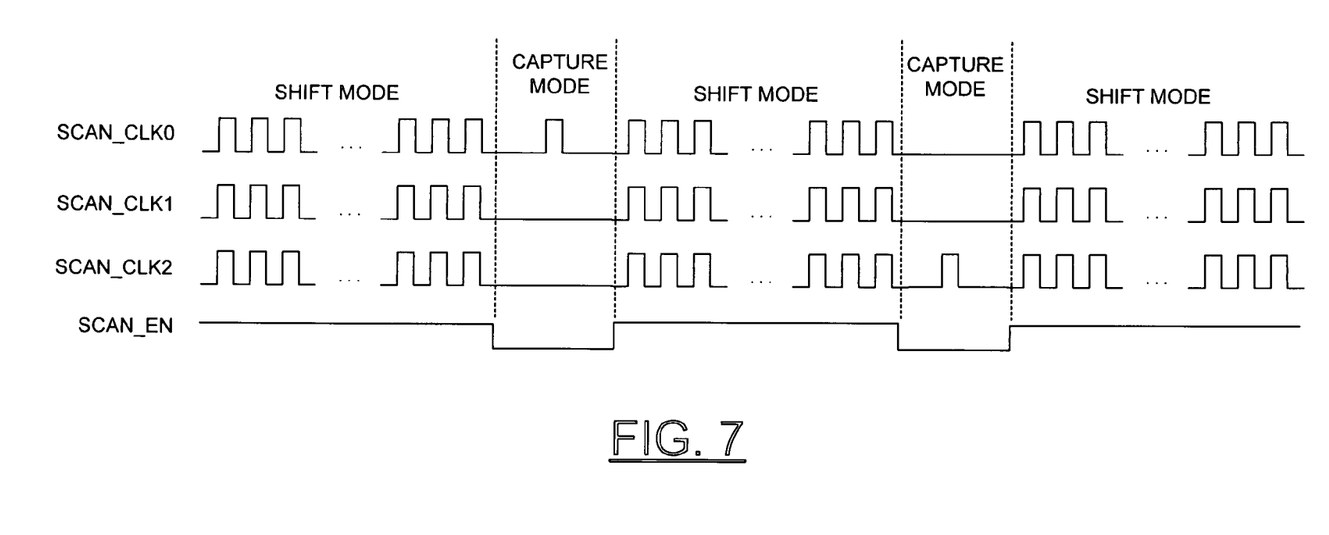
FIG. 7 is a diagram illustrating scan clocks during shift and capture modes with one capture pulse.

Referring to FIG. 7, a set of typical waveforms that are supplied by the ATPG tool on the scan clock ports is shown. FIG. 7 illustrates the case where the user allows the ATPG tool to generate only one capture pulse per capture mode. A setup check between two scan clocks is not normally needed, since only one clock is toggled.

Figure 8:
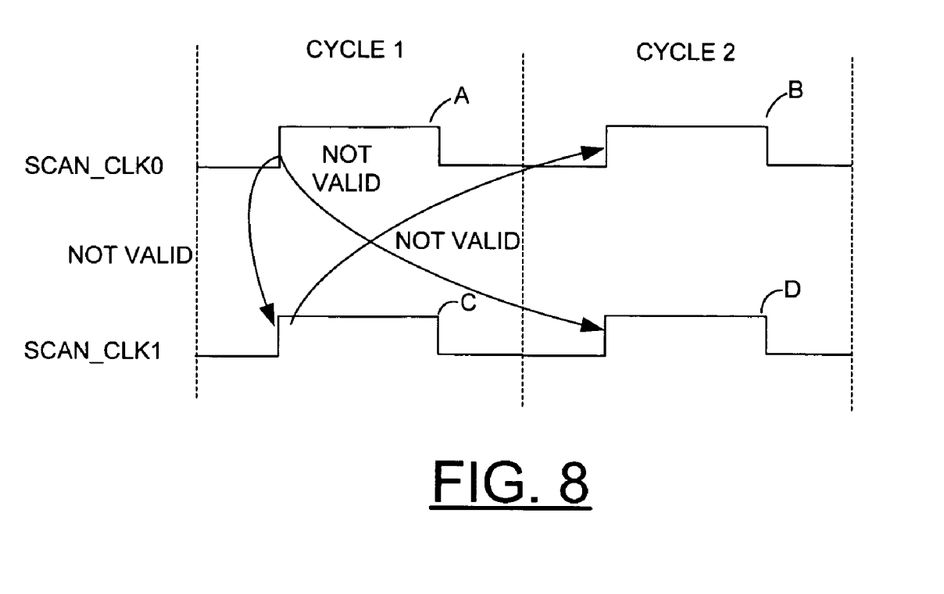
FIG. 8 is a diagram illustrating timing within one clock domain.

Referring to FIG. 8, only the timing within one clock domain should be checked. The timing arcs between the pulses A and D, the pulses C and B, and the pulses A and C should be ignored (i.e., not a valid case since only one pulse is given by the ATPG tool on one scan clock).

The present invention may ensure getting accurate reports with only the real violated paths. Analyzing STA of capture mode without the present invention may cause the reporting of numerous false hold violations, and mask the real ones. The present invention may cover both the shift mode and the capture mode, and takes into account the special timing that is supplied by the ATPG tool to the scan clocks.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

Additionally, inverters may be added to change a particular polarity of the signals. As used herein, the term "simultaneously" is meant to describe events that share some common time period but the term is not meant to be limited to events that begin at the same point in time, end at the same point in time, or have the same duration.

The present invention may be used to analyze portions of a code division multiple access (CDMA) chipset utilizing high speed designs that use multiple clock domains. A static timing analysis performed for a new CDMA design may allow layouts to be verified and any deficiencies corrected prior to taping out a new integrated circuit for next generation wireless mobile voice and data applications. The present invention may also be employed by the ASIC engineers to maintain existing CDMA and related designs for integration into larger systems and systems-on-a-chip. While the present invention may be useful in CDMA designs, the present invention may be applied to static timing analysis of other designs as well.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
    a circuit configured to be tested; and
    a plurality of test blocks within said circuit each comprising (i) a plurality of sequential elements and (ii) a plurality of logic elements, wherein (i) each of said test blocks are configured to operate (a) in a first mode comprising a shift mode and (b) a second mode comprising a capture mode, (ii) said shift mode operates with multiple scan clocks that are toggled simultaneously, and (iii) said capture mode operates with multiple scan clocks with only one of the scan clocks being toggled at a time, wherein said shift mode and said capture mode comprise portions of static timing analysis.

2. The apparatus according to claim 1, wherein one of said test blocks includes a lock-up latch positioned at an end of said plurality of sequential elements.

3. The apparatus according to claim 2, wherein said lock-up latch is configured to prevent timing violations when said one of said test blocks operates in said shift mode.

4. The apparatus according to claim 1, wherein said shift mode comprises simultaneously pulsing all of said scan clocks and said capture mode comprises pulsing one of said scan clocks at a time.

5. The apparatus according to claim 1, wherein said capture mode comprises clocking one of said scan clocks at a time and said scan mode comprises simultaneously clocking all of said scan clocks.

6. The apparatus according to claim 1, wherein each of said sequential elements comprises a flip-flop.

7. The apparatus according to claim 1, wherein said apparatus fixes timing violations in response to said shift mode and said capture mode.

8. The apparatus according to claim 1, wherein said apparatus executes (i) a first test run in said shift mode and (ii) a second and third test run in said capture mode.

9. The apparatus according to claim 8, wherein said apparatus inserts one or more false path statements between each of said test runs.

10. The apparatus according to the claim 1, wherein a static timing analysis is performed while in said capture mode to perform a setup timing check.

11. The apparatus according to claim 1, wherein one or more false path statements are inserted into said apparatus when said apparatus is in said capture mode.

12. The apparatus according to claim 11, wherein said one or more false path statements instruct a static timing analysis tool to ignore timing arcs between two or more of said multiple scan clocks.

13. The apparatus according to claim 1, wherein one of said test blocks includes a lock-up latch configured to prevent timing violations when said one of said test blocks operates in said shift mode.

14. A method for performing static timing analysis comprising the steps of:

(A) implementing a plurality of test blocks each comprising (i) a plurality of test elements and (ii) a plurality of logic elements; and (B) operating in (i) a capture mode using multiple scan clocks with only one of the scan clocks being toggled at a time; and (ii) a shift mode using multiple scan clocks being toggled simultaneously wherein said shift mode and said capture mode comprise portions of static timing analysis.

15. The method according to claim 14, wherein step (B) comprises:

executing a first test run in said shift mode; and executing a second and a third test run in said capture mode.

16. The method according to claim 15, further comprising the step of:

fixing timing violation errors in response to executing said first test run, said second test run and said third test run.

17. The method according to claim 15, further comprising the step of:

inserting one or more false path statements between each of said execution steps.

18. The method according to claim 14, further comprising the step of:

performing a static timing analysis while in said capture mode to perform a setup timing check.

19. An apparatus for performing static timing analysis comprising the steps of:

means for implementing a plurality of test blocks each comprising (i) a plurality of test elements and (ii) a plurality of logic elements; and means for operating in a capture mode using multiple scan clocks with only one of the scan clocks being toggled at a time; and means for operating in a shift mode using multiple scan clocks being toggled at a time wherein said shift mode and said capture mode comprise portions of static timing analysis.

* * * * *